United States Patent [19]

Mori et al.

[11] Patent Number: 4,737,961
[45] Date of Patent: Apr. 12, 1988

[54] SEMICONDUCTOR LASER WITH COMPLEMENTARY MESA STRUCTURES

[75] Inventors: Yoshifumi Mori, Chiba; Tsunekazu Okada, Kanagawa, both of Japan

[73] Assignee: Sony Corporation, Tokyo, Japan

[21] Appl. No.: 826,837

[22] Filed: Feb. 6, 1986

[30] Foreign Application Priority Data

Feb. 8, 1985 [JP] Japan .................. 60-22989

[51] Int. Cl.$^4$ .............................. H01S 3/19
[52] U.S. Cl. .......................... 372/46; 372/44
[58] Field of Search ................ 372/44, 45, 46

[56] References Cited

U.S. PATENT DOCUMENTS

| | | | |
|---|---|---|---|
| 4,099,305 | 7/1978 | Cho et al. | 372/46 |
| 4,215,319 | 7/1980 | Botez | 372/46 |
| 4,429,397 | 1/1984 | Sugimoto et al. | 372/46 |
| 4,647,953 | 3/1987 | Okajima et al. | 372/46 |

FOREIGN PATENT DOCUMENTS 2115608  9/1983  United Kingdom ............ 372/46

OTHER PUBLICATIONS

Kishino et al., "Mesa-Substrate Buried-Heterostructure GaInAsP/InP Injection Lasers", *Electronics Letters*, vol. 15, No. 4, Feb. 15, 1979, pp. 134–136.

*Primary Examiner*—James W. Davie
*Attorney, Agent, or Firm*—Hill, Van Santen, Steadman & Simpson

[57] ABSTRACT

A semiconductor laser has a semiconductor substrate with a feature on its surface. The feature, either a projection or a groove, forms a mesa or a mesa groove having relatively sharp edges. Active layers and cladding layers are deposited on this seimconductor substrate. The cladding layer deposited directly on the semiconductor substrate has at least one slope opposite the mesa or mesa groove, on which slope no active layer is formed during epitaxial growth. The active layer immediately above the cladding layer is prevented from depositing on the slope of the cladding layer so that no etching process for removing sections of the active layer is necessary. This allows deposition of the active layers and cladding layers on the semiconductor substrate in an uninterrupted sequence of single epitaxial growth steps.

24 Claims, 2 Drawing Sheets

SEMICONDUCTOR LASER WITH COMPLEMENTARY MESA STRUCTURES

BACKGROUND OF THE INVENTION

The present invention relates to a semiconductor laser, such as a buried hetero-junction type (BH type) semiconductor laser made of AlGaAs compound semiconductor. The invention also relates to a process for fabricating semiconductor lasers.

In the recent years, various kinds of semiconductor lasers have been proposed. Among these prior proposed semiconductor lasers, the BH-type semiconductor laser has been considered to be a typical and ideal single-mode laser structure. BH-type semiconductor lasers have been disclosed in the Japanese Patent First Publication (Tokkai) showa 50(1980)-119584. BH type semiconductor lasers have an active layer vertically and horizontally surrounded by a cladding layer which has a smaller refractive index and a wider inhibiting band. Recently, it has also been reported that high-power BH lasers can be obtained by means of an optical waveguide and circuit-channeling layers which define a small circular spot. This structure lowers the threshold current substantially, thus allowing higher output.

Although such BH-type semiconductor lasers have the advantages set forth above, they also require a large number of production process steps. For instance, in order to form the current-channelling layer, a special etching process and at least two steps of liquid state epitaxy are required. These complicated production processes tend to degrade reproducibility and yield.

SUMMARY OF THE INVENTION

It is a principal object of the present invention to provide a semiconductor laser and production process thereof, which can resolve the aforementioned problem in production of the semiconductor laser.

Another object of the present invention is to provide a semiconductor laser and production process thereof which do not require etching to fabricate the current-channelling layer.

A further object of the invention is to provide a process for fabricating semiconductor lasers in which an active layer and an epitaxial growth layer can be deposited in a single epitaxial growth process.

In order to accomplish the aforementioned and other objects, a semiconductor laser, according to the present invention, has a semiconductor substrate with a feature on its surface. The feature, either a projection or a groove, forms a mesa or a mesa groove having relatively sharp edges. Active layers and cladding layers are deposited on this semiconductor substrate. The cladding layer deposited directly on the semiconductor substrate has at least one slope opposite the mesa or mesa groove, on which slope no active layer is formed during epitaxial growth.

According to the invention, the active layer immediately above the cladding layer is prevented from depositing on the slope of the cladding layer so that no etching process for removing sections of the active layer is necessary. This allows deposition of the active layers and cladding layers on the semiconductor substrate in an uninterrupted sequence of single epitaxial growth steps.

In the preferred structure, the semiconductor substrate has a (100) crystal face and the cladding layer formed directly on the semiconductor substrate has (111) B crystal face. Epitaxial growth is preferable performed by metal-organic chemical vapour deposition (MOCVD).

Since the semiconductor laser, according to the present invention, can be produced by means of a single epitaxial growth process, uniformity and coordination between the layers can be attained, which can greatly increase yield.

According to one aspect of the present invention, semiconductor laser comprises a semiconductor substrate having a first and second surfaces on its opposite sides, first lower and second upper cladding layers on said first surface, an active layer between said first lower and second upper cladding layers, a cap layer atop said second cladding layer, an insulating layer atop said cap layer, a first electrode atop said insulating layer, a second electrode formed on said second surface of said semicondutor substrate, a feature on said first surface of said semiconductor substrate so configured that said first cladding layer atop said feature is sloped to either side of said feature, on which slopes substantially no active layer can grow during epitaxial growth of said active layer, whereby said feature induces discontinuities in said active layer at said slopes, and a channel passing through said insulating layer at a position opposite said feature through which said first electrode can oppose a section of said active layer atop said feature, thereby forming a resonating region therebetween.

The semiconductor substrate is formed of a conductive n-type semiconductor. The first and second cladding layers are conductive layers of opposite polarity. The active layer is of the same polarity as said first cladding layer.

The feature is a mesa defining a pair of slopes along opposite edges thereof, which slopes induce growth of slopes in said first cladding layer during epitaxial growth of said first cladding layer and having crystal faces on which the epitaxial growth rate of semiconductor layers thereon is significantly slower than other faces. The crystal face of said slopes of said first cladding layer is the (111) B crystal surface. The crystal face of said first surface is the (100) crystal face.

In the preferred embodiment, the semiconductor is a AlGaAs system compound. In order to form the semiconductor of AlGaAs system compound, the semiconductor substrate is an n-type GaAs system, III - V family compound, the first cladding layer is made of n-type $Al_xGa_{1-x}As$, said second cladding layer is made of p-type $Al_xGa_{1-x}As$, and the active layer is made of $Al_yGa_{1-y}As$, and wherein $x>y$.

A semiconductor laser may further comprise an optical waveguide layer between said active layer and said first cladding layer.

According to another aspect of the invention, a semiconductor laser comprises a semiconductor substrate having first and second surfaces on its opposite sides, first lower and second upper cladding layers on said first surface, an active layer between said first lower and second upper cladding layers, a cap layer over said second cladding layer, and insulator layer over said cap layer, a first electrode over said insulator layer, a second electrode on said second surface of said semicondutor substrate, in which at least said first and second cladding layers and said active layers are formed by a sequence of expitaxial growth steps, and a production process for producing said semiconductor laser including a step of forming a feature on said first surface of said semiconductor substrate so configured that said first cladding layer atop said feature is sloped to either side of said feature, on which slopes substantially no active layer can grow during epitaxial growth thereof, so that said feature induces discontinuities in said active layer opposite said slopes, said feature forming step being performed prior to any epitaxial growth steps, said semiconductor layer production process further including a step of forming a channel through said insulator layer at a position opposite said feature through which said first electrode opposes a section of said active layer above said feature so as to form a resonating region therebetween.

The feature forming step is performed by an etching process by masking said semiconductor substrate at the position at which said feature is to be formed. The sequence of epitaxial growth steps forms said first and second cladding layer, said active layer, said cap layer and said insulating layer.

According to a further aspect of the invention a process is provided for producing a semiconductor laser which comprises a semiconductor substrate having a first and second surfaces on its opposite sides, first lower and second upper cladding layers on said first surface, an active layer between said first lower and second upper cladding layers, a cap layer over said second cladding layer, an insulating layer over said cap layer, a first electrode over said insulator layer, and a second electrode on said second surface of said semiconductor substrate, which process comprises the steps of:

forming a feature on said first surface of said semiconductor substrate so configured that said first cladding layer atop said feature is sloped to either side of said feature, on which slopes substantially no active layer can grow during epitaxial growth thereof, whereby said feature induces discontinuities in said active layer;

performing a sequence of epitaxial growth steps so as to form said first and second cladding layers and said active layers, said cap layer and said insulating layer;

forming a channel through said insulating layer at a position opposite said feature; and forming said first and second electrodes on said first and second surfaces of said semiconductor substrate, said first electrode opposing a section of said active layer above said feature and forming a resonating region therebetween.

The feature forming step is performed by etching said substrate so as to form a mesa with a pair of slopes along either edge thereof, which slopes induce the growth of slopes in said first cladding layer during epitaxial growth of said first cladding layer and have crystal faces on which the epitaxial growth rate of layer material thereon is significantly slower than on other crystal faces.

In the preferred process, the crystal face of said slopes of said first cladding layer is the (111) B crystal surface, and the crystal face of said first surface is the (100) crystal face.

By the preferred process as set forth, a semiconductor is made of a AlGaAs system compound.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment, but are for explanation and understanding only.

In the drawings.

DESCRIPTION OF THE PREFERRED EMBODIMENTS

Figure 1:
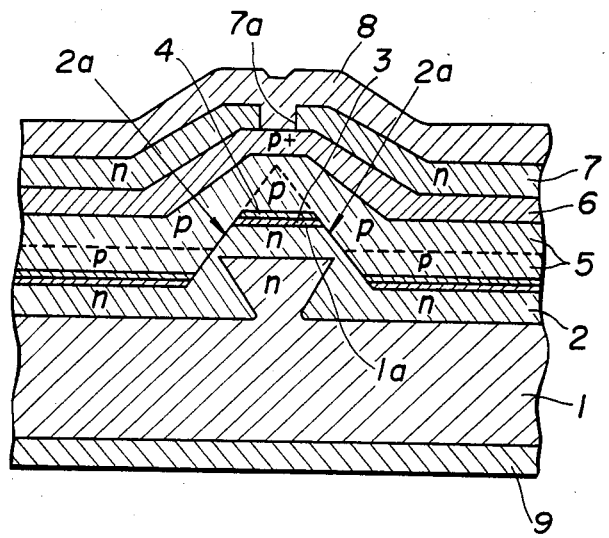
FIG. 1 is a cross-section through a sample of the preferred embodiment of a semiconductor laser according to the invention.

Referring now to the drawings, particularly to FIG. 1, the preferred embodiment of a semiconductor laser has a conductive n-type semiconductor substrate 1. The semiconductor substrate 1 is an n-type compound, for example and its surface is a (100) crystal face. An etchmask mesa is deposited on the surface of the semiconductor substrate 1. In practice, a plurality of mesas 1a run in parallel across the surface of the semiconductor substrate in a direction perpendicular to the section plane.

Although the shown preferred embodiment employs mesas 1a on the surface of the semiconductor substrate, mesa grooves can be employed in place of the mesas.

A first cladding layer 2 is deposited on the (100) face of the semiconductor substrate. The first cladding layer 2 is preferably a conductive n-type layer. An optical waveguide layer 3 and an active layer 4 are deposited on the first cladding layer 2. The optical waveguide layer 3 is not always necessary and may be used when desired. The active layer 4 is of lightly doped or undoped material. A second cladding layer 5 lies above the active layer 4. The second cladding layer 5 is of the conductive p-type. A conductive p-type cap layer 6 is formed above the second cladding layer. A conductive n-type auxiliary current-channelling layer 7 covers the cap layer 6 incompletely, as is explained below.

The first and second cladding layers 2 and 5, the optical waveguide layer 3, the active layer 4, the cap layer 6 and the auxiliary current-channelling layer 7 are all deposited on the semiconductor layer 1 by epitaxial growth, such as MOCVD. The first and second cladding layers 2 and 5 have a smaller refraction index and a wider inhibiting band than the active layer.

The form of the mesa 1a on the (100) crystal face of the semiconductor substrate 1 is selected with respect to the crystal structure so that the first cladding layer 2 has sloping faces 2a on both sides of the mesa 1a. The sloping faces 2a extend along the longitudinal edges of the mesa and are of the (111) B crystal face. The (111) B crystal face grows relatively slowly in epitaxial growth, i.e. as much as 100 times as slow as the (100) crystal face. Therefore, during epitaxial growth of the aforementioned layers, there will be substantially no growth on this (111) B crystal face. Therefore, the optical waveguide layer 3 and the active layer 4 which are much thinner than the other layers do not appear at all on the (111) B crystal face. Therefore, the optical waveguide layer 3 and the active layer 4 have discontinuous breaks on the (111) B crystal faces. The second cladding layer 5 can be grown on the first cladding layer 2 at points opposite the (111) B crystal faces simply by overgrowth from the portions which do not oppose the (111) B crystal faces. The thickness of the second cladding layer 5 overall is chosen so as to deposit an sufficient thickness of the second cladding layer at the portions opposite the (111) B crystal faces.

The auxiliary current-channelling layer has cut-out 7a. An electrode 8 is deposited over the auxiliary current-channelling layer. Part of the electrode 8 passes through the cut-out 7a and makes an ohmic connection with cap layer 6. In order to form oscillation region or resonating space on the mesa 1a, the cut-out of the auxiliary current-channelling layer directly opposes the active layer 4 above the mesa 1a. Therefore, the cut-out 7a in the auxiliary current-channelling layer extends longitudinally along the axis of the mesa 1a of the semiconductor substrate 1.

As shown in FIG. 1, another electrode 9 is deposited on the opposite surface of the semiconductor substrate.

FIGS. 2(A) to 2(G) illustrate the process of producing the aforementioned preferred embodiment of the semiconductor laser according to the invention, for facilitating better understanding of the invention. The process shown in FIGS. 2(A) to 2(G) is specifically adapted to form a AlGaAs (III-V family compound) semiconductor laser.

Figure 2A:
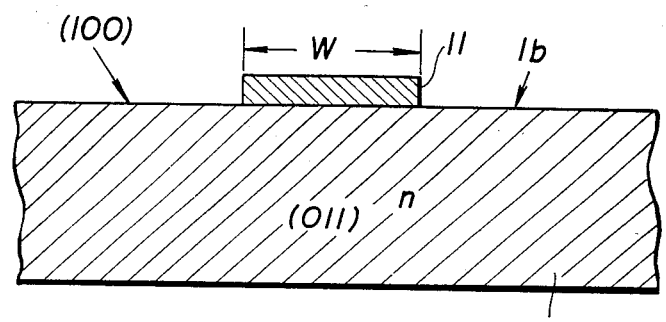
FIGS. 2(A) to 2(G) show the sequence of production steps used to fabricate the preferred embodiment of the semiconductor laser of FIG. 1.

First, the semiconductor substrate 1 is fabricated, which is an n-type, III-V family compound semiconductor substrate, for example n-type GaAs compound semiconductor substrate. The major surface 1b of the semiconductor substrate 1 is a (100) crystal face. An etching mask ribbon 11 of a desired width W is formed on the major surface 1b of the semiconductor substrate 1. This etching mask 11 is fabricated by well-known processes, including the steps of depositing a photo-resist layer on the semiconductor substrate, subjecting the photo-resist layer to pattern exposure, and developing. In this case, the face lying parallel to the plane through which the section of FIG. 1 is taken is selected to be the (011) face. The longitudinal axis of the etching mask 11 is perpendicular to the (011) face, as shown in FIG. 2(A).

Figure 2B:
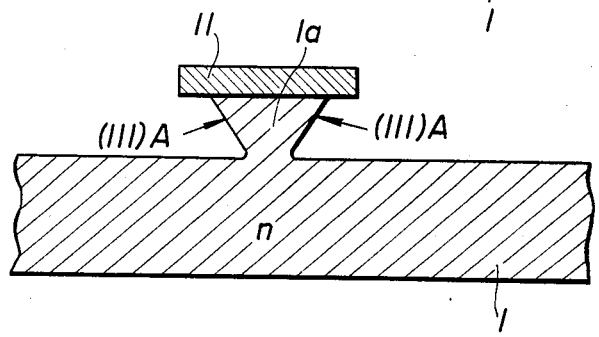
Figure 2C:
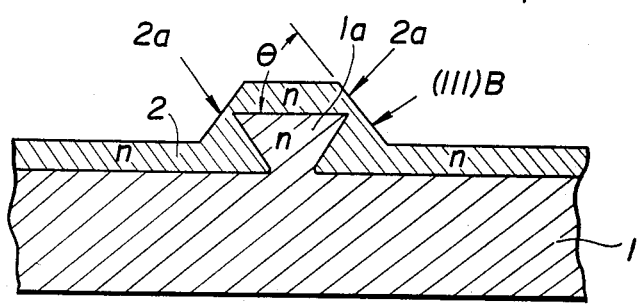

Then, etching is performed by means of an etching agent, such as phosphoric etching solution. The etching agent is applied to the major surface 1b of the semiconductor substrate 1 on which the photo-resist layer was deposited and pattern-exposure and developing were performed. The portion of the semiconductor substrate 1 which was not masked by the etching mask 11 is eroded to form numerous parallel mesas 1a, each as shown in FIG. 2(B). The mesa 1a thus formed has (111) A faces on both receding faces.

After this, the etching mask 11 is removed and the first cladding layer 2 is formed by epitaxial growth. The first cladding layer 2 is made of n-type $Al_xGa_{1-x}As$. (111) B crystal faces naturally grow on from the receding faces of the mesa 1a. The slopes 2a with the (111) B crystal faces lie at an angle $\theta$ relative to the horizontal upper surface of the mesa 1a. The angle $\theta$ is approximately 55°. Once the epitaxial growth reaches the state shown in FIG. 2(C) growth of the first cladding layer 2 is stopped.

Figure 2D:
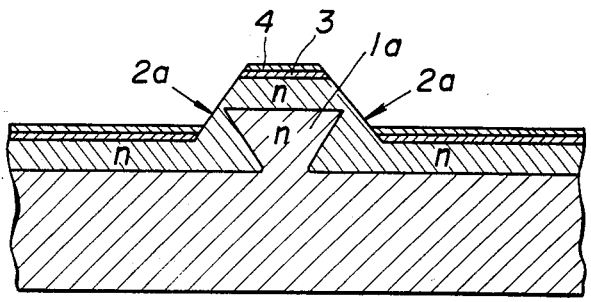

At this time, the deposition material gas is switched and subsequently MOCVD is performed to deposit the optical waveguide layer 3 and the active layer 4, as shown in FIG. 2(D). The active layer 4 is made of $Al_yGa_{1-y}As$. As described above, the epitaxial growth rate on (111) B crystal faces is relatively slow as set forth above. Therefore, the optical waveguide layer 3 and the active layer 4 deposited on the (111) B crystal face slopes 2a of the fisrt cladding layer 2 will be of negligible thickness. Therefore, the optical waveguide layer and the active layer 4 will have breaks along the slopes 2a of the first cladding layer.

Figure 2E:
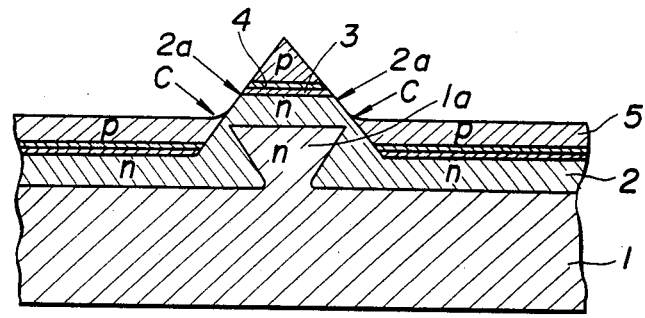
Figure 2F:
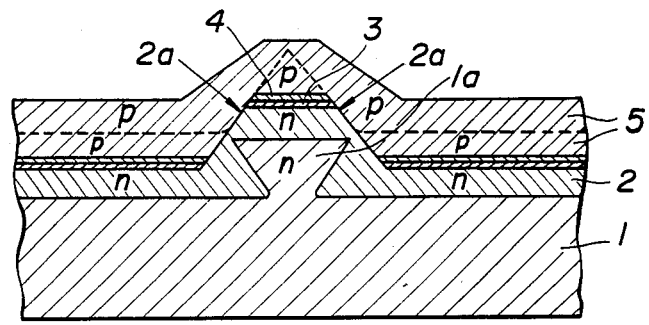

Then, the deposition material is again changed and the 2nd cladding layer 5 is added by epitaxial growth. In this embodiment, the second cladding layer 5 is made of p-type $Al_xGa_{1-x}As$. In this case, as shown in FIG. 2(E), the second cladding layer 5 is not deposited on the (111) B crystal face slopes 2a of the first cladding layer 2 in the initial stages of growth. During this initial growth period, the second cladding layer 5 is built up over the active layer 4. Atop the mesa, the second cladding layer 5 grows to have slopes substantially in alignment with the slopes of the first cladding layer 2. At the same time, the second cladding layer 5 on either side of the mesa 1a starts to build up slowly along the slopes 2a at the portions c in FIG. 2(E). By further growth, the second cladding layer 5 comes to cover the slopes 2a of the first cladding layer 2, as shown in FIG. (F). Thus the second cladding layer 5 covers the entire surface including the active layre 4.

Then, again the deposition material gas is changed for deposition of the cap layer 6. In the preferred embodiment, the cap layer 6 is made of highly-doped p-type GaAs. Thereafter, the auxiliary current-channelling layer of $Al_zGa_{1-z}As$ is deposited over the cap layer 6.

Figure 2G:
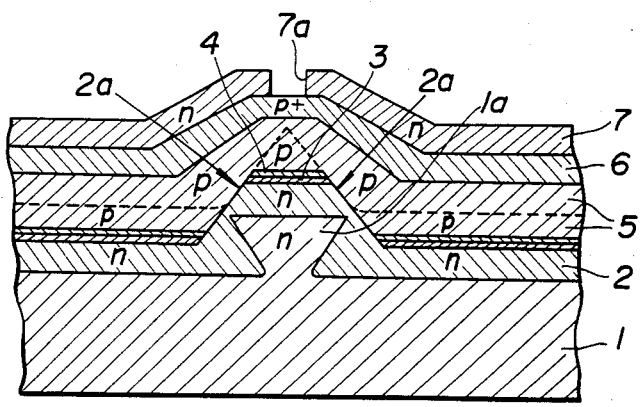

The cut-out 7a in the auxiliary current-channelling layer 7 is formed by etching, as shown in FIG. 2(G). The cut-out 7a exposes a small area of the second cladding layer 5. Then, as shown in FIG. 1, the first and second electrodes 8 and 9 are formed on both surfaces of the finished assembly. Part of the electrode 8 passes through the cut-out 7a and is in contact with the second cladding layer 5.

As will be appreciated herefrom, according to the present invention, MOCVD can be performed continuously to form different layers only by changing the gaseous deposition material. Thus, fabrication involves only a sequence of continuous MOCVD steps, which simplifies the production process of the semiconductor laser.

The first and second cladding layers 2 and 5 are made of $Al_xGA_{1-x}As$ and the active layer 4 is made of $Al_yGa_{1-y}As$, where $x>y$.

It should be noted that the optical waveguide layer 3 can be made of a material richer in Al than the active layer 4. In this case, the AlGaAs layer forming the optical waveguide layer 3 will have a wider inhibiting band. Furthermore, as set forth above, the present invention is applicable to semiconductor lasers with no optical waveguide layers.

As will be appreciated herefrom, the thickness of the second cladding layer is determined by the width of the top surface of the mesa and the thickness of the first cladding layer. By selecting these dimensions appropriately, an adequately narrow resonating region above the mesa can be ensured without the need for an etching process.

The cross-section of the need not be as illustrated in the preferred embodiment. Mesas of various cross-section can be employed in the process according to the invention. The only essential matter is that the mesa has a slope which slows down the growth speed of the cladding layer deposited thereabove. For example, a mesa which tapers downward to a broad base can be employed by appropriately selecting the slope angle.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A semiconductor laser comprising:
   a semiconductor substrate having a first and second surfaces on its opposite sides;
   first lower and second upper cladding layers on said first surface;
   an active layer between said first lower and second upper cladding layers;
   a cap layer atop said second cladding layer;
   an insulating layer atop said cap layer;
   a first electrode atop said insulating layer;
   a second electrode formed on said second surface of said semiconductor substrate;
   an inverted mesa structure on said first surface of said semiconductor substrate so configured that said first cladding layer atop said inverted mesa structure is sloped to either side of said mesa structure, on which slopes substantially no active layer can grow during epitaxial growth of said active layer, whereby said inverted mesa structure induces discontinuities in said active layer at said slopes; and
   a channel passing through said insulating layer at a position opposite said mesa structure through which said first electrode can oppose a section of said active layer atop said inverted mesa structure, thereby forming a resonating region therebetween.

2. A semiconductor laser as set forth in claim 1, wherein said semiconductor substrate is formed of a conductive n-type semiconductor.

3. A semiconductor laser as set forth in claim 2, wherein said first and second cladding layers are conductive layers of opposite polarity.

4. A semiconductor laser as set forth in claim 3, wherein said active layer is of the same polarity as said first cladding layer.

5. A semiconductor laser as set forth in claim 4, wherein said inverted mesa structure induces growth of mesa slopes in said first cladding layer during epitaxial growth of said first cladding layer and having crystal faces on which the epitaxial growth rate of semiconductor layers thereon is significantly slower than other faces.

6. A semiconductor laser as set forth in claim 5, wherein the crystal face of said slopes of said first cladding layer is the (111) B crystal surface.

7. A semiconductor laser as set forth in claim 6, wherein the crystal face of said first surface is the (100) crystal face.

8. A semiconductor laser as set forth in claim 7, wherein said semiconductor is a AlGaAs system compound.

9. A semiconductor laser as set forth in claim 8, wherein said semiconductor substrate is an n-type GaAs system, III - V family compound.

10. A semiconductor laser as set forth in claim 9, wherein said first cladding layer is made of n-type $Al_xGa_{1-x}As$, said second cladding layer is made of p-type $Al_xGa_{1-x}As$.

11. A semiconductor laser as set forth in claim 10, wherein said active layer is made of $Al_yGa_{1-y}As$, and wherein $x > y$.

12. A semiconductor laser as set forth in claim 11, which further comprises an optical waveguide layer between said active layer and said first cladding layer.

13. A semiconductor laser comprising: a semiconductor substrate having first and second surface on its opposite sides, said first surface having an inverted mesa structure formed thereon, first lower and second upper cladding layers on said first surface, said first lower cladding layer having a mesa structure thereon, an active layer between portions of said first lower and second upper cladding layers, a cap layer over said second cladding layer, an insulator layer over said cap layer, a first electrode over said insulator layer, a second electrode on said second surface of said semiconductor substrate, in which at least said first and second cladding layers and said active layer are formed by a sequence of epitaxial growth steps, a channel through said insulator layer at a position opposite said inverted mesa structure through which said first electrode opposes a section of said active layer above said inverted mesa structure so as to form a resonating region therebetween.

14. A semiconductor laser as set forth in claim 13, wherein said semiconductor substrate is made of a conductive n-type semiconductor.

15. A semiconductor laser as set forth in claim 14, wherein said first and second cladding layers are conductive layers of opposite polarity.

16. A semiconductor laser as set forth in claim 15, wherein said active layer has the same polarity as said first cladding layer.

17. A semiconductor laser as set forth in claim 14, wherein said inverted mesa structure is a mesa with a pair of slopes along either edge thereof, which slopes induce growth of slopes in said first cladding layer during epitaxial growth of said first cladding layer and are crystal faces on which the growth rate of semiconductor layers thereon is significantly slower than on other crystal faces.

18. A semiconductor laser as set forth in claim 17, wherein said crystal face of said slopes of said first cladding layer is the (111) B crystal surface.

19. A semiconductor laser as set forth in claim 18, wherein the crystal face of said first surface is the (100) crystal face.

20. A semiconductor laser as set forth in claim 19, wherein said semiconductor is a AlGaAs system compound.

21. A semiconductor laser as set forth in claim 20, wherein said semiconductor substrate is made of an n-type GaAs system, III - V family compound.

22. A semiconductor laser as set forth in claim 21, wherein said first cladding layer is made of n-type $Al_xGa_{1-x}As$, and said second cladding layer is made of p-type $Al_xGa_{1-x}As$.

23. A semiconductor laser as set forth in claim 22, wherein said active layer is made of $Al_yGa_{1-y}As$, and wherein $x > y$.

24. A semiconductor laser as set forth in claim 23, which further comprises an optical waveguide layer between said active layer and said first cladding layer.

* * * * *